(12) United States Patent
Chen et al.

(10) Patent No.: US 7,697,297 B2
(45) Date of Patent: Apr. 13, 2010

(54) HEAT DISSIPATION DEVICE HAVING A CLIP ASSEMBLY

(75) Inventors: Chun-Chi Chen, Taipei Hsien (TW); Min Li, Shenzhen (CN); Hong-Cheng Yang, Shenzhen (CN)

(73) Assignees: Fu Zhun Precision Industry (Shen Zhen) Co., Ltd., Shenzhen, Guangdong Province (CN); Foxcomm Technology Co., Ltd., Tu-Cheng, Taipei Hsien (TW)

( * ) Notice: Subject to any disclaimer, the term of this patent is extended or adjusted under 35 U.S.C. 154(b) by 225 days.

(21) Appl. No.: 11/947,091

(22) Filed: Nov. 29, 2007

(65) Prior Publication Data
US 2009/0141453 A1 Jun. 4, 2009

(51) Int. Cl.
*H05K 7/20* (2006.01)
(52) U.S. Cl. .............. 361/719; 361/709; 361/710; 361/702; 361/703; 361/679.54
(58) Field of Classification Search ........... 361/702, 361/703, 709, 710, 718, 719, 679.54; 439/487; 24/548; 248/510
See application file for complete search history.

(56) References Cited

U.S. PATENT DOCUMENTS

| | | | | |
|---|---|---|---|---|
| 5,331,507 A * | 7/1994 | Kyung et al. | | 361/720 |
| 5,386,338 A * | 1/1995 | Jordan et al. | | 361/704 |
| 5,464,054 A * | 11/1995 | Hinshaw et al. | | 165/80.3 |
| 5,615,735 A * | 4/1997 | Yoshida et al. | | 165/80.3 |
| 5,677,829 A * | 10/1997 | Clemens | | 361/697 |
| 5,730,210 A * | 3/1998 | Kou | | 165/80.3 |
| 5,761,041 A * | 6/1998 | Hassanzadeh et al. | | 361/704 |
| 5,932,925 A * | 8/1999 | McIntyre | | 257/719 |
| 6,175,499 B1 * | 1/2001 | Adams et al. | | 361/704 |
| 6,229,703 B1 * | 5/2001 | Lee | | 361/704 |
| 6,392,886 B1 * | 5/2002 | Lee et al. | | 361/703 |
| 6,424,530 B1 * | 7/2002 | Lee et al. | | 361/704 |
| 6,518,507 B1 * | 2/2003 | Chen | | 174/252 |
| 6,644,387 B1 * | 11/2003 | Lee et al. | | 165/80.3 |
| 6,717,814 B2 * | 4/2004 | Li | | 361/704 |
| 6,775,138 B2 * | 8/2004 | Lee et al. | | 361/697 |
| 7,142,429 B2 * | 11/2006 | Hsieh et al. | | 361/710 |
| 7,292,444 B1 * | 11/2007 | Yang et al. | | 361/709 |
| 7,324,344 B2 * | 1/2008 | Sya et al. | | 361/719 |
| 7,333,338 B2 * | 2/2008 | Lai et al. | | 361/715 |
| 7,382,622 B2 * | 6/2008 | Li et al. | | 361/719 |
| 7,385,822 B1 * | 6/2008 | Li et al. | | 361/709 |

(Continued)

FOREIGN PATENT DOCUMENTS

WO    WO 9629850 A1 * 9/1996

*Primary Examiner*—Anatoly Vortman
(74) *Attorney, Agent, or Firm*—Frank R. Niranjan

(57) ABSTRACT

A heat dissipation device for removing heat from an electronic component mounted on a printed circuit board, includes a heat sink and a clip attaching the heat sink onto the printed circuit board. The heat sink has a rectangular base and a plurality of fins extending upwardly from the base. The fins define a receiving channel therein, which is slantwise to two opposite sides of the heat sink. The clip includes a main body placed in the receiving channel and two latching legs extending obliquely and oppositely from two opposite ends of the main body. The two latching legs are located in front of and in rear of the two opposite sides of the heat sink, respectively, and are parallel thereto.

18 Claims, 4 Drawing Sheets

U.S. PATENT DOCUMENTS

| | | | |
|---|---|---|---|
| 7,417,860 B2 * | 8/2008 | Yang et al. | 361/710 |
| 7,508,674 B2 * | 3/2009 | Li et al. | 361/704 |
| 7,518,874 B2 * | 4/2009 | Deng et al. | 361/710 |
| 2009/0034199 A1 * | 2/2009 | Yu et al. | 361/704 |

* cited by examiner

HEAT DISSIPATION DEVICE HAVING A CLIP ASSEMBLY

BACKGROUND OF THE INVENTION

1. Field of the Invention

The present invention relates to a heat dissipation device, and more particularly to a heat dissipation device having a clip assembly which can readily and securely attach a heat sink to an electronic component.

2. Description of Related Art

A heat sink is usually placed in thermal contact with an electronic package such as a central processing unit (CPU), and transfers heat through conduction away from the electronic package so as to prevent over-heating of the electronic package. Usually, the heat sink is secured to the electronic package by using a clip.

U.S. Pat. No. 6,518,507 B1 shows a heat sink assembly including a heat sink and a clip securing the heat sink to an electronic component mounted on a printed circuit board. The heat sink comprises a base and a plurality of fins extending from the base. A plurality of grooves is defined between adjacent fins. Two neighboring fins located at two lateral sides of the groove in the middle of the heat sink project a pair of bulges on opposite inner walls thereof. The clip spans across the groove in the middle of the heat sink with a positioning portion received in the middle of the heat sink in a manner such that the positioning portion abuts against the bulges and the base of the heat sink. Two arms, which extend from two ends of the positioning portion, have a pair of hooks engaging with the printed circuit board, thereby securing the heat sink to the printed circuit board.

The clip can prevent the heat sink from sliding with respect to the printed circuit board along a direction perpendicular to the grooves of the heat sink. However, the heat sink is prone to move along the direction where the grooves extend, when the heat sink is subject to vibration. This makes the heat sink not able to have an intimate contact with the electronic component, whereby the heat generated by the electronic component cannot be effectively dissipated by the heat sink.

What is needed, therefore, is a heat dissipation device having an improved clip assembly which can overcome the above problem.

SUMMARY OF THE INVENTION

A heat dissipation device for removing heat from an electronic component mounted on a printed circuit board is disclosed. The heat dissipation device includes a heat sink and a clip attaching the heat sink onto the printed circuit board. The heat sink has a rectangular base whose bottom face is for contacting with the electronic component. A plurality of fins extends upwardly from the base. A slantwise receiving channel is defined in the fins and through two opposite sides of the heat sink. The clip includes a main body placed in the receiving channel and two latching legs extending obliquely and oppositely from two opposite ends of the main body, respectively. The two latching legs are located in front of and in rear of the two opposite sides of the heat sink, respectively, and are parallel thereto.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
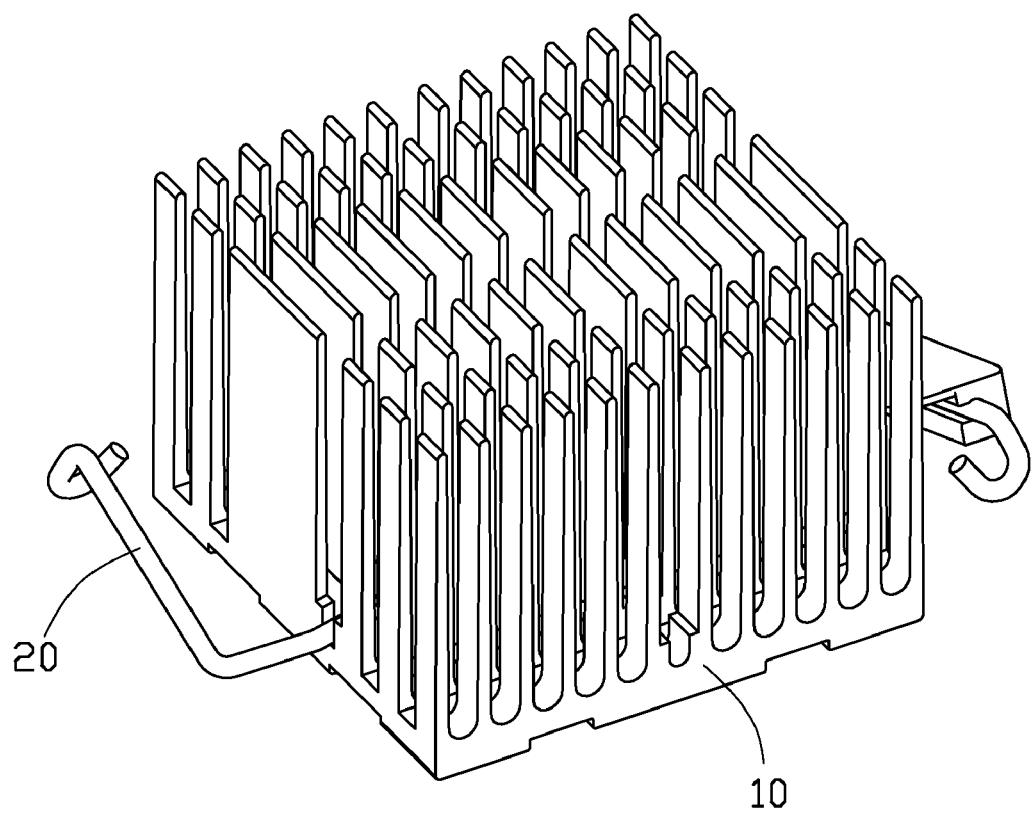
FIG. 1 is an assembled view of a heat dissipation device in accordance with a preferred embodiment of the present invention.
Figure 2:
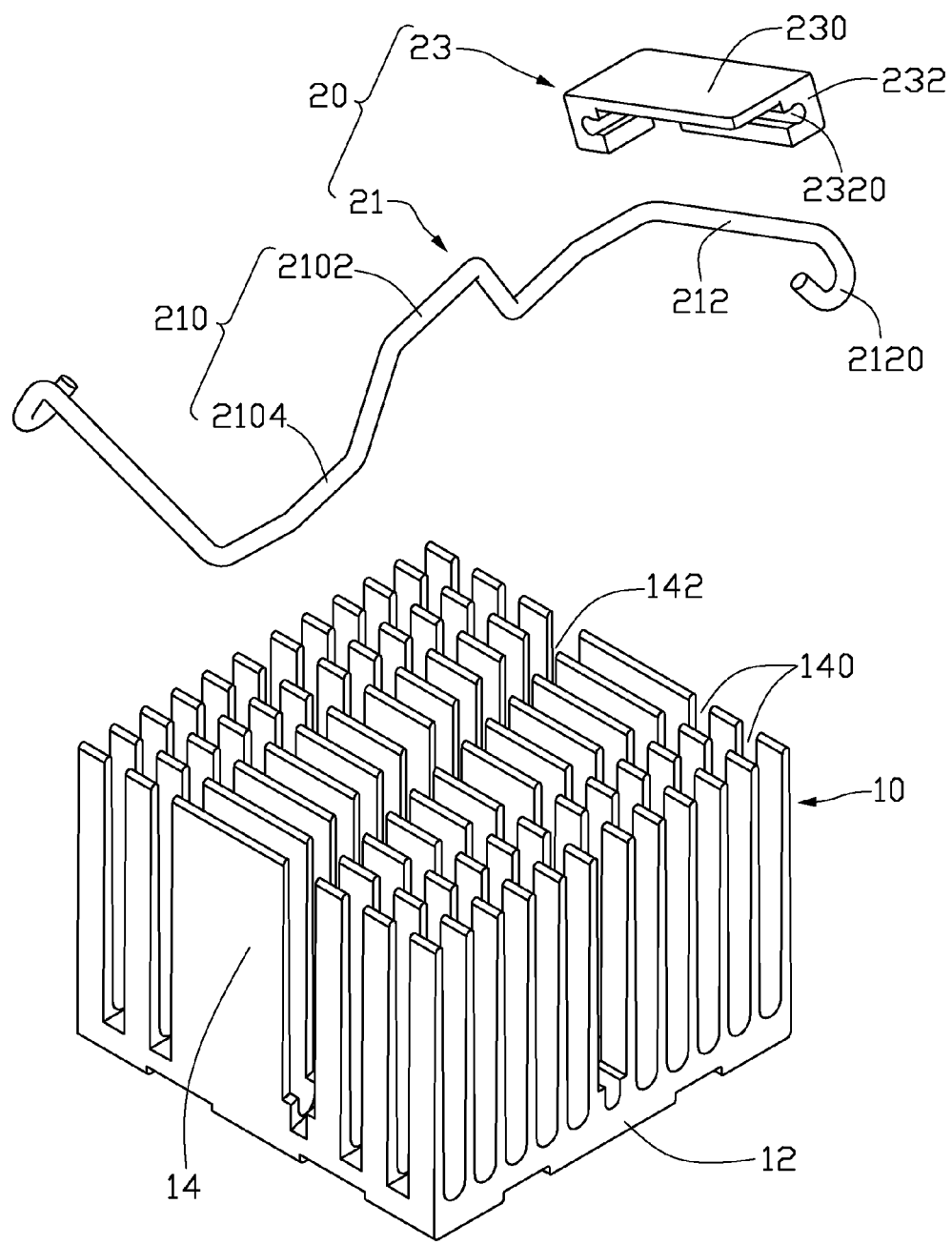
FIG. 2 is an exploded, isometric view of FIG. 1.

Referring to FIGS. 1-2, a heat dissipation device in accordance with a preferred embodiment of the invention is shown. The heat dissipation device includes a heat sink 10 having a bottom for contacting with an electronic component (not shown) mounted on a printed circuit board (not shown) and a clip assembly 20 spanning on the heat sink 10 to secure the heat sink 10 onto the printed circuit board so that the heat sink 10 can have an intimate contact with the electronic component.

The heat sink 10 comprises a rectangular base 12 having a bottom face for thermally contacting with the electronic component, and a plurality of fins 14 integrally extending upwardly and perpendicularly from a top face of the base 12. The fins 14 are parallel to front and rear sides of the heat sink 10 and spaced from each other with a predetermined distance. The heat sink 10 defines a plurality of elongated channels 140 therein. The elongated channels 140 are perpendicular to the fins 14 and located at two lateral portions of the heat sink 10 and separate the fins 14 into sections. The elongated channels 140 are parallel to the two lateral sides of the heat sink 10. The heat sink 10 defines a receiving channel 142 in a middle portion thereof, for accommodating the clip assembly 20. The receiving channel 142 spans through the fins 14 and the front and rear sides of the heat sink 10 and cuts off each of the fins 14. The receiving channel 142 is oblique to the fins 14 and the elongated channels 140.

The clip assembly 20 is disposed in the receiving channel 142 of the heat sink 10 and rests on the base 12 of the heat sink 10. The clip assembly 20 comprises a wire clip 21 and an operating member 23 mounted on the wire clip 21 for facilitating operation of the wire clip 21. The wire clip 21 is made from a single piece of spring wire and comprises a main body 210 and two latching legs 212 extending obliquely and oppositely from two opposite ends of the main body 210. The main body 210 comprises an inhibiting section 2102, and two pivot sections 2104 extending from two ends of the inhibiting section 2102. The two pivot sections 2104 are substantially in line with each other and sandwich the inhibiting section 2102 therebetween. The inhibiting section 2102 is upwardly offset from and substantially parallel to the pivot sections 2104. The two latching legs 212 are parallel to each other and extend oppositely from two respective free ends of the two pivot sections 2104 of the main body 210. Each distal end of the latching legs 212 is provided with a hook 2120 facing inwardly for engaging with one of two anchors (not shown) mounted on the printed circuit board. The hook 2120 is formed by bending the distal end of the latching leg 212 downwardly and then upwardly so that the hook 2120 has a U-shaped configuration.

The operating member 23, which is integrally formed by plastic injection molding, comprises a top plate 230 and two sidewalls 232 extending perpendicularly from two neighboring edges of the top plate 230. The two sidewalls 232 are separated from each other and each define a corresponding engaging groove 2320 therein. The two engaging grooves 2320 are parallel to the top plate 230 and include a short one in the side wall 232 extending from the short side edge of the top plate 230 and a long one in the sidewall 232 extending from the long side edge of the top plate 230. The operating member 23 is coupled to one of the latching legs 212 of the wire clip 21 by interferentially fitting a portion of the pivot section 2104 and a portion of the latching leg 212 respectively into the short and long engaging grooves 2320.

Figure 3:
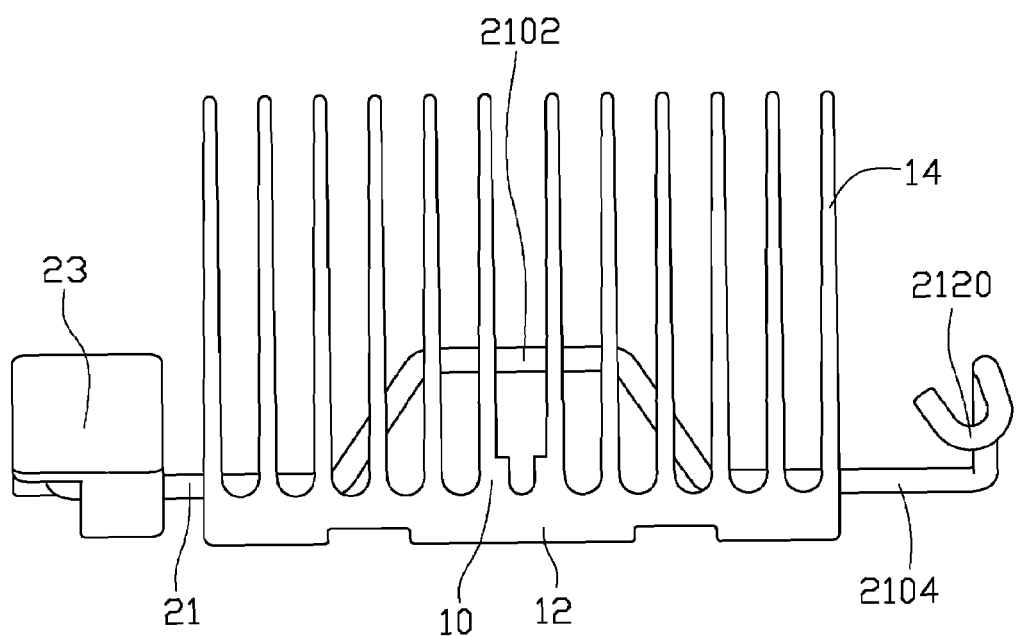
FIG. 3 is a side view of FIG. 1.
Figure 4:
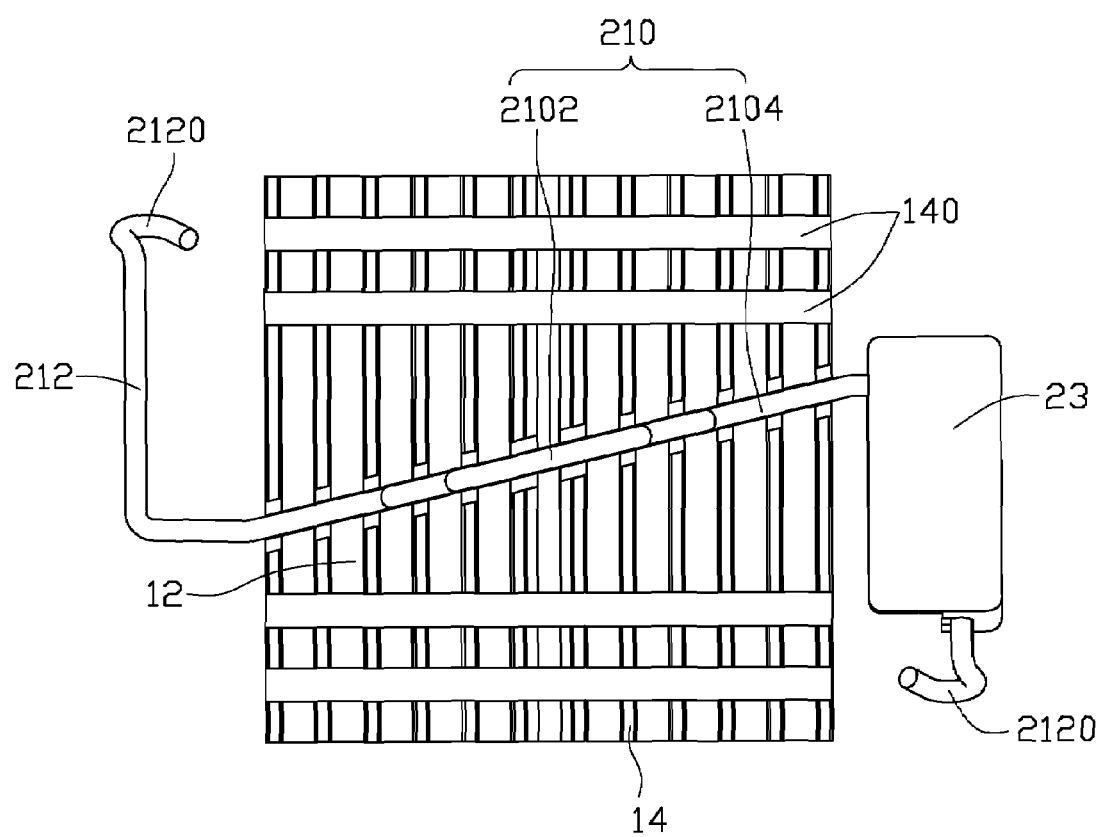
FIG. 4 is a top view of FIG. 1.

As shown in FIG. 3 and FIG. 4, to secure the heat sink 10 on the printed circuit board, the main body 210 of the wire clip 21 is placed in the receiving channel 142 of the heat sink 10, the two opposite latching legs 212 parallel to the fins 14 are respectively located in front of the front side and in rear of the rear side of the heat sink 10. The pivot sections 2104 of the main body 210 rest on the top surface of the base 12 of the heat sink 10. One of the latching legs 212 without the operating member 23 is rotated downwardly relative to the corresponding pivot section 2104 to make the hook 2120 of the latching leg 212 to reach and engage with the corresponding anchor mounted on the printed circuit board. During rotation of the latching leg 212, the inhibiting section 2102 of the main body 210 is blocked by sidewalls the fins 14 defining the receiving channel 142, whereby the inhibiting section 2102 is prevented from rotation. The operating member 23 is then pressed downwardly to force the other latching leg 212 to rotate downwardly whereby the other hook is moved to engage with the other corresponding anchor. The hooks 2120 of the two latching legs 212 securely engage with the two anchors and the pivot sections 2104 are twisted and press the base 12 of the heat sink 10 downwards; the heat sink 10 is thus securely mounted on the printed circuit board and has an intimate contact with the electronic component.

According to the preferred embodiment of the present invention, in use of the clip assembly 20, the main body 210 of the clip 21 is snugly received in the receiving channel 142 which is slantwise to the fins 14 of the heat sink 10, whereby the main body 210 is able to securely lock the heat sink 10 and restrict the heat sink 10 from moving longitudinally and transversely.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention

What is claimed is:

1. A heat dissipation device for removing heat from an electronic component mounted on a printed circuit board, the heat dissipation device comprising:
   a heat sink having a bottom for contacting the electronic component, and defining a receiving channel spanning thereon and slantwise to two opposite sides thereof; and
   a clip comprising a main body placed in the receiving channel and two latching legs extending obliquely and oppositely from two opposite ends of the main body, respectively, the two latching legs being located in front of and in rear of the two opposite sides of the heat sink, respectively, and being parallel to the two opposite sides of the heat sink.

2. The heat dissipation device as claimed in claim 1, wherein the heat sink comprises a base and a plurality of parallel fins extending upwardly from the base, and each of the fins is parallel to the two opposite sides of the heat sink and cut off by the receiving channel.

3. The heat dissipation device as claimed in claim 1, wherein the main body of the clip comprises two pivot sections resting on the heat sink and an inhibiting section sandwiched between and offset upwardly from the two pivot sections.

4. The heat dissipation device as claimed in claim 3, wherein the inhibiting section is snugly received in the receiving channel of the heat sink and restricts the main body from rotating.

5. The heat dissipation device as claimed in claim 1, wherein the latching legs each form a hook at a distal end thereof and are adapted to be rotated downwardly relative to a corresponding pivot section to force the hook to engage with the printed circuit board.

6. The heat dissipation device as claimed in claim 1, further comprising an operating member, wherein the operating member is mounted on one of the latching legs.

7. The heat dissipation device as claimed in claim 6, wherein the operating member comprises a top plate and two sidewalls extending perpendicularly from two neighboring edges of the top plate.

8. The heat dissipation device as claimed in claim 7, wherein the two sidewalls respectively engage with the one of the latching legs and the main body of the clip.

9. A heat dissipation device for removing heat from an electronic component mounted on a printed circuit board, the heat dissipation device comprising:
   a heat sink comprising a rectangular base for contacting the electronic component and a plurality of parallel fins extending upwardly from the base, the heat sink defining a receiving channel that spans over the base and is slantwise to the fins and two opposite sides of the heat sink; and
   a clip comprising a main body placed in the receiving channel and two latching legs extending obliquely and oppositely from two opposite ends of the main body, respectively, the two latching legs being located in front of and in rear of the two opposite sides of the heat sink, and being parallel to the two opposite sides.

10. The heat dissipation device as claimed in claim 9, wherein the fins are parallel to the two opposite sides of the heat sink and cut off by the receiving channel.

11. The heat dissipation device as claimed in claim 9, wherein the main body of the clip comprises two pivot sections resting on the heat sink and an inhibiting section sandwiched between and offset upwardly from the two pivot sections.

12. The heat dissipation device as claimed in claim 11, wherein the inhibiting section is snugly received in the receiving channel of the heat sink and restricts the main body from rotating.

13. The heat dissipation device as claimed in claim 9, wherein the latching legs each form a hook at distal end thereof and are adapted to be rotated downwardly relative to a corresponding pivot section to force the hook to engage with the printed circuit board.

14. The heat dissipation device as claimed in claim 9, further comprising an operating member, wherein the operating member is mounted on one of the latching legs.

15. The heat dissipation device as claimed in claim 14, wherein the operating member comprises a top plate and two sidewalls extending perpendicularly from two neighboring edges of the top plate.

16. The heat dissipation device as claimed in claim 15, wherein the two sidewalls respectively engage with the one of the latching legs and the main body of the clip.

17. A heat dissipation device comprising:

a heat sink having a base;

a plurality of fins extending upwardly from the base, a receiving channel slantwise extending through the fins; and a clip having a main body fitted in the receiving channel and a pair of latching legs extending obliquely from two opposite ends of the main body along opposite directions, respectively, each leg having a hook formed at a free end thereof, the hook being adapted for engaging with a printed circuit board thereby securing the heat sink to the printed circuit board, wherein the main body extends slantwise between the pair of latching legs.

18. The heat dissipation device as claimed in claim 17, wherein the main body of the clip comprises a middle inhibiting section and two pivot sections extending oppositely from opposite ends of the inhibiting section, the pivot sections being in line with each other while the inhibiting section is offset a distance from the pivot sections.

* * * * *